United States Patent
Taniguchi

(10) Patent No.: US 7,608,369 B2
(45) Date of Patent: Oct. 27, 2009

(54) PHOTOMASK TO WHICH PHASE SHIFT IS APPLIED AND EXPOSURE APPARATUS

(75) Inventor: Yukio Taniguchi, Yokohama (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 552 days.

(21) Appl. No.: 11/372,075

(22) Filed: Mar. 10, 2006

(65) Prior Publication Data

US 2006/0210888 A1 Sep. 21, 2006

(30) Foreign Application Priority Data

Mar. 18, 2005 (JP) .............................. 2005-080446

(51) Int. Cl.
G03F 1/00 (2006.01)
(52) U.S. Cl. ............................................. 430/5; 355/53
(58) Field of Classification Search ........................ 430/5
See application file for complete search history.

(56) References Cited

U.S. PATENT DOCUMENTS 5,677,755 A * 10/1997 Oshida et al. .................. 355/53
2002/0068227 A1 * 6/2002 Wang et al. .................... 430/5

FOREIGN PATENT DOCUMENTS

| JP | 5-11434 | 1/1993 |
| JP | 7-36174 | 2/1995 |
| JP | 7-176476 | 7/1995 |
| JP | 9-120154 | 5/1997 |
| JP | 2002-116528 | 4/2002 |

OTHER PUBLICATIONS

Ruoping Wang, et al., "Polarized Phase Shift Mask: Concept, Design, and Potential Advantages to Photolithography Process and Physical Design", Proceedings of SPIE, vol. 4562, 2002, pp. xix-xxx.

* cited by examiner

*Primary Examiner*—Mark F Huff
*Assistant Examiner*—Stewart A Fraser
(74) *Attorney, Agent, or Firm*—Oblon, Spivak, McClelland, Maier & Neustadt, L.L.P.

(57) ABSTRACT

A problem of a decrease in transmissive light, which partly occurs at a boundary between two polarization modulation regions of a polarized phase shift mask, is solved. A photomask for use in an exposure apparatus which forms an exposure pattern by illumination includes at least two polarization modulation regions which produce mutually incoherent polarized light components and adjoin each other, at least two phase modulation regions which impart a phase difference of 180° and adjoin each other, and amplitude modulation regions which decrease transmittance. A contact line between the polarization modulation regions and a contact line between the phase modulation regions are located at a corresponding position, and the amplitude modulation regions are provided on both sides of the common contact line, with a predetermined distance from the common contact line.

8 Claims, 13 Drawing Sheets

Light with electric field perpendicular to lattice is passed

Light with electric field parallel to lattice is reflected

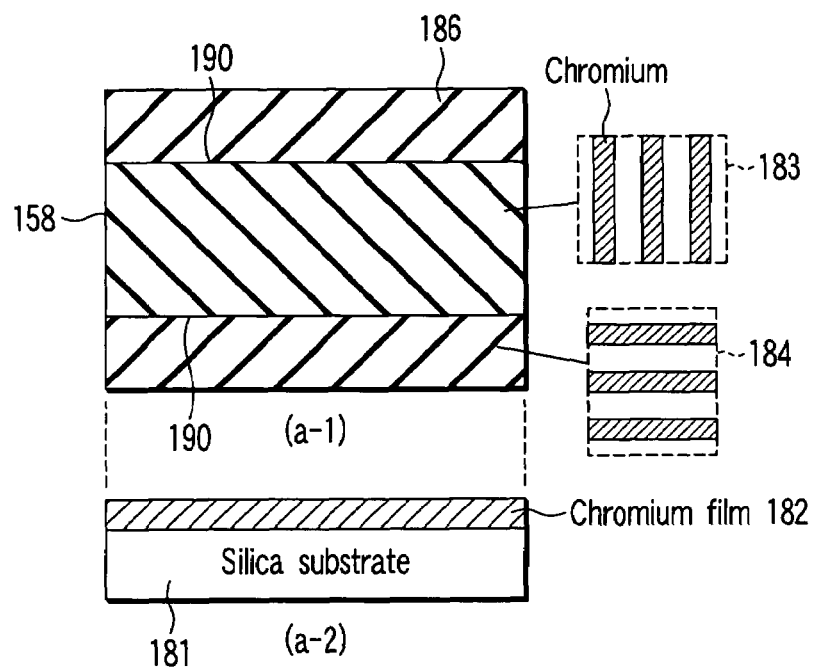
F I G. 10A
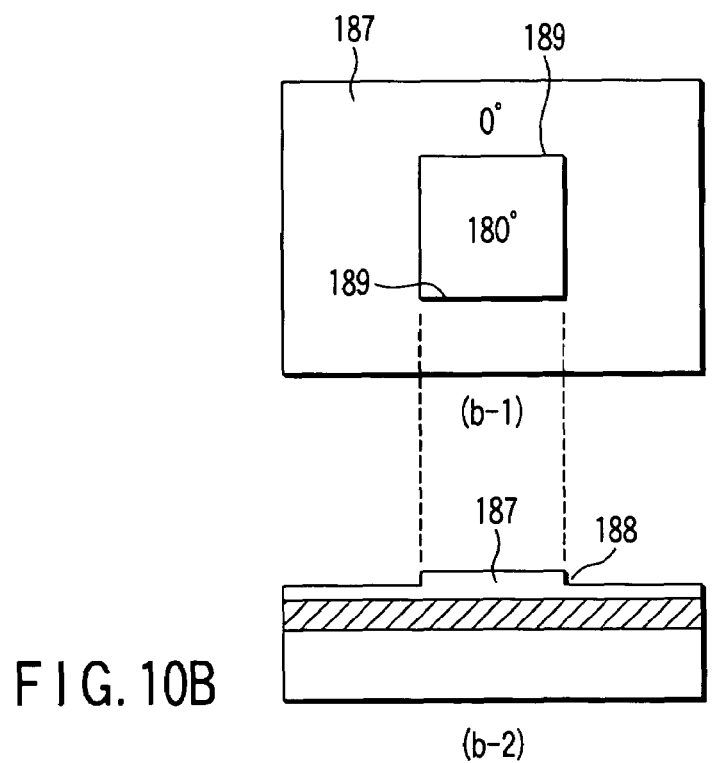
F I G. 10B

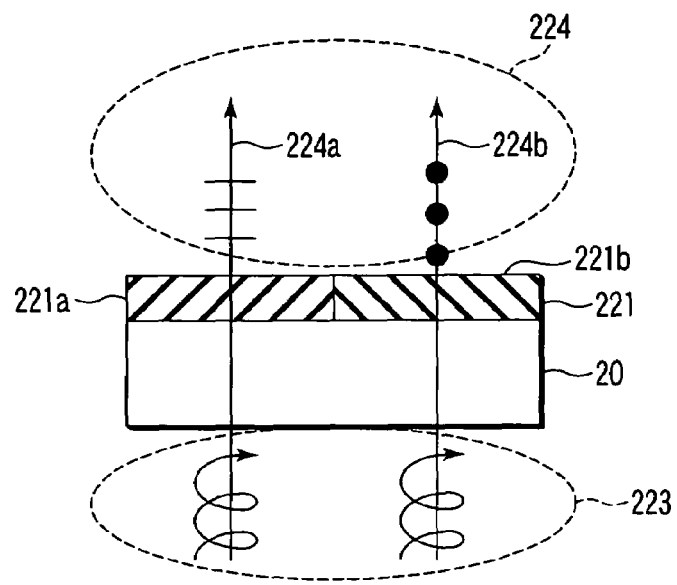
FIG. 12
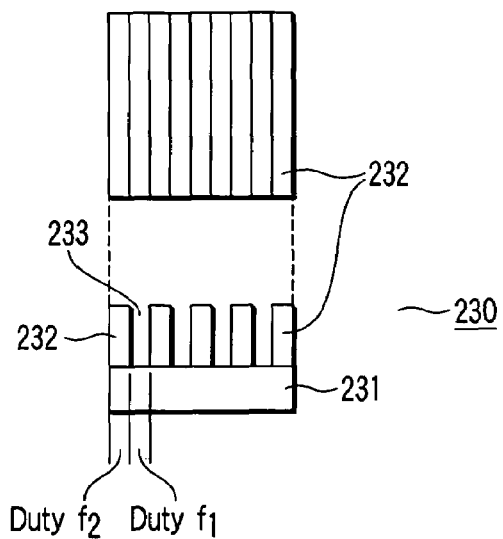
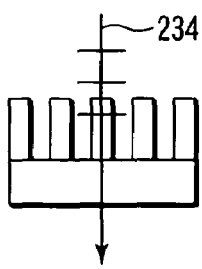
FIG. 14A
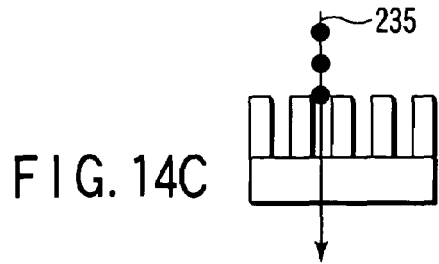
FIG. 14B    FIG. 14C

PHOTOMASK TO WHICH PHASE SHIFT IS APPLIED AND EXPOSURE APPARATUS

CROSS-REFERENCE TO RELATED APPLICATIONS

This application is based upon and claims the benefit of priority from prior Japanese Patent Application No. 2005-080446, filed Mar. 18, 2005, the entire contents of which are incorporated herein by reference.

BACKGROUND OF THE INVENTION

1. Field of the Invention

The present invention relates generally to a photomask for use in a projection exposure method, and more particularly to a phase shift mask for use in fabricating a device with a fine structure, such as a semiconductor device or a liquid crystal display device.

2. Description of the Related Art

In a semiconductor device fabrication process or a liquid crystal display device fabrication process, photolithography techniques are generally employed. In the photolithography, a photoresist is coated on a substrate on which a semiconductor device or a liquid crystal display device is to be formed, or on a thin film that is formed on the substrate. The photoresist is selectively exposed, thus forming a mask for microfabrication, such as an etching mask. Using the etching mask, the substrate or the thin film on the substrate is subjected to a selective etching process, etc.

A photomask for exposure is used in order to perform selective exposure of the photoresist. A conventional photomask for exposure is formed, for example, by providing a light-shield pattern on a transparent substrate. Thereby, the intensity of transmissive light is amplitude-modulated. Typically, the photomask for exposure is configured such that a light-shield pattern of a metal thin film of, e.g. chromium is formed on a transparent substrate. Light is radiated to pass through the photomask, and an image of a light-shield pattern is focused on the substrate by a projection optical system. Thus, a desired circuit pattern is transferred to the substrate.

Further, in order to enhance the contrast of a fine projected image, various kinds of phase shift masks have recently been used, which are configured such that phase shift portions for varying the phase of transmissive light are provided at specific locations on transparent portions. An example of such a phase shift mask is a Shibuya-Levenson type phase shift mask. In the phase shift mask, transmissive regions for forming fine projected pattern portions are provided with phase shifter regions which provide a phase difference of 180° between the transmissive regions. When light from a light source (generally, unpolarized light including various polarization modes) is radiated on the mask, a clear dark part is formed at an overlapping part of light components that pass through both phase shifter regions. The reason is that the same polarized light components interfere with each other with opposite phases.

As a result, a light-shield region that is interposed between both phase shifter regions, or a projected pattern portion indicating the boundary between both phase shifter regions, is clearly formed. Hence, the resolution of the fine projected pattern image can be enhanced, or the focal depth can be increased.

As has been described above, in the field of microfabrication of, e.g. a semiconductor device fabrication process or a liquid crystal display device fabrication process, the amplitude-modulation type photomask that generates the above-described amplitude distribution or the phase shift mask that also generates the phase distribution is used as the photomask for use in exposure of the resist.

In order to form a finer pattern, a "polarized phase shift mask", which has a function of polarizing radiation light, in addition to the above-described functions, has recently been proposed. In the polarized phase shift mask, regions that create different polarization states are formed with a predetermined distribution.

The purpose of use of the polarized phase shift mask is to solve the problem of "phase conflict", which is a problem with conventional phase shift masks (limited to a Shibuya-Levenson mask or an alternating phase shift mask in the present case). Prior-art documents, which describe the phase conflict, include Ruoping Wang et al., Polarized Phase Shift Mask: Concept, Design, and Potential Advantages to Photolithography Process and Physical Design, Proceedings of SPIE Vol. 4562, 406-417 (2002), Jpn. Pat. Appln. KOKAI Publication No. 2002-116528, and Jpn. Pat. Appln. KOKAI Publication No. 5-11434. A general description of the phase conflict will be given below.

FIG. 1 shows an example of a phase shift mask (Shibuya-Levenson mask) 100. FIG. 1 shows an exposure pattern in a case where a phase shift function is to be applied to two isolated linear patterns 103 and 104. Dark parts (indicated in black) are light-shield parts 101 which become non-exposed parts. In the case of using the phase shift mask (Shibuya-Levenson mask), it is necessary to provide a phase difference of 180° between both sides of the light-shield part 101, which is a fine line that is an object of microfabrication.

In the structure shown in FIG. 1, however, a boundary 102, which has a phase difference of 180°, is also formed at a location other than the location of the light-shield parts 101. The part of the boundary 102 becomes a non-exposed part since the light intensity at this part becomes zero due to interference. Consequently, in the case of using a positive-type resist in which an exposed part is removed, a corresponding resist part is not removed and remains. Conversely, in the case of using a negative-type resist, a corresponding resist part is removed (in the description below, a positive-type resist is used).

In order to solve this problem, a so-called "polarized phase shift mask" 110, as shown in FIG. 2, has been developed. The polarized phase shift mask is configured such that a function of a polarized mask is added to the conventional phase shift mask 100 shown in FIG. 1, thereby to solve the problem of phase conflict.

In FIG. 2, arrows 111 and 112 indicate directions of linear polarizers provided on the mask, that is, directions of linearly polarized light that has just passed through the mask. No interference occurs between light rays in different polarization directions. Hence, even if there is a phase difference at a boundary 113, the intensity of the transmissive light does not become zero, and there arises no such problem that a corresponding resist part is left (however, this problem is not completely solved, as will be described later).

In order to realize the above-described function, a fine patterning process for forming a structure with a polarizing function on a photomask is indispensable in the formation of the polarized phase shift mask. As specific methods which realize formation of the polarizing function, methods of providing electrical conductor lattices, for example, are disclosed in Jpn. Pat. Appln. KOKAI Publications Nos. 9-120154, 7-36174 and 7-176476.

FIG. 3A to FIG. 3C show a mask 120 which is provided with an electrical conductor lattice 121 of, e.g. chromium, in order to constitute a polarizing function. The electrical conductor lattice 121 is generally called "grid polarizer". As shown in FIG. 3A, for example, the electrical conductor lattice 121 is a lattice that is formed of a plurality of conductors 122 with a lattice pitch less than the wavelength of exposure light.

The electrical conductor lattice 121 shown in FIG. 3A has such a feature that light 123 with a direction of electric field that is perpendicular to the lattice is transmitted (124), as shown in FIG. 3B, and light 125 with a direction of electric field that is parallel to the lattice is reflected (126), as shown in FIG. 3C. Accordingly, the electrical conductor lattice 121 is usable as a linear polarizer. With the electrical conductor lattice 121, the function of the polarization mask can be realized.

The electrical conductor lattice 121 can be fabricated by an ordinary lithography method which is used, for example, in a semiconductor device manufacturing process in which microfabrication can be performed. Specifically, a chromium thin film, for instance, is formed on a silica substrate 127 by sputtering, following which resist coating, patterning and etching are performed to fabricate the electrical conductor lattice 121.

Aside from the grid polarizer, a photonic crystal is known as a material of a polarization modulation element which realizes the function of the linear polarizer. In addition, a material having birefringence effect is usable for the polarization modulation element. A structural birefringence element or a photonic crystal is known as achieving birefringence effect.

Next, a description is given of the problem in the case of using the polarized phase shift mask as a photomask, as shown in FIG. 2. In the above description of the prior art, it is stated that "No interference occurs between light rays in different polarization directions. Hence, even if there is a phase difference at a boundary 113, the intensity of the transmissive light does not become zero, and there arises no such problem that a corresponding resist part is left". It has been understood, however, that this effect is incomplete.

FIG. 4 shows a cross-sectional view (a) of a polarized phase shift mask 130, and a calculation result (b) of a light intensity distribution of transmissive light in a part where a phase conflict due to the polarized phase shift mask is to be eliminated. In FIG. 4, the polarized phase shift mask 130 is configured such that two polarization modulation regions 131 and 132 are formed on a transparent substrate 137, and two phase modulation regions 133 and 134 are formed on the polarization modulation regions 131 and 132. The conditions for an optical system are set as follows: wavelength=365 nm, NA (numerical aperture)=0.25, and σ=(coherence factor)= 0.4. All calculation results below are based on these conditions.

The inventors analyzed transmissive light from the polarized phase shift mask 130 shown in part (a) of FIG. 4. It was found that the light intensity distribution of the transmissive light does not have an ideal flat characteristic, but has such a characteristic as shown in part (b) of FIG. 4.

In part (b) of FIG. 4, a curve A indicates the intensity of light that has passed through a region A (phase 0°) and a curve B indicates the intensity of light that has passed through a region B (phase 180°). An actual light intensity distribution of the light that has passed through the mask 130 is the sum of both intensities, which is indicated by a curve C in part (b) of FIG. 4. In this patent specification including descriptions below, the light intensity is expressed by a value which is set by normalizing the light intensity in the background part of the mask (i.e. the part which normally passes light) at 1.

According to the calculation result shown in part (b) of FIG. 4, the light intensity at a boundary 135 between the regions A and B is 0.5. This value is higher than a theoretical light intensity of zero, which is based only on a phase shifter without the polarization modulation regions 131 and 132, but it does not become 1 (a part 136 at which the light intensity is minimum is referred to as "dip part", and the light intensity at the dip part is referred to as "dip intensity"). Owing to the formation of the dip part, if the exposure amount decreases, the exposure amount may, in some cases, fall below the threshold of the resist at the position corresponding to the dip part. In such cases, a resist portion may possibly remain due to deficiency in exposure. To be more specific, compared to the case where the dip intensity is 1, the "exposure amount tolerance", which realizes formation of a desired pattern, becomes narrower.

Next, an example of the exposure amount tolerance is calculated in brief. In the description below, the exposure amount is defined as follows: (exposure amount)=(intensity of background part)×(exposure time). In addition, a proper exposure amount is normalized at 1, and the threshold (i.e. boundary of dissolution/non-dissolution) of the resist in this case is set at 0.4. Under the conditions in FIG. 4, if the exposure amount decreases only slightly from the proper value 1 to 0.8 (=0.4/0.5) or less, the exposure amount at the boundary 135 falls below the threshold of 0.4. As a result, the resist is not removed and remains at the dip part 136. If the dip part 136 does not occur, there arises no such problem that the resist remains at the exposure amount of 0.4. In other words, the exposure tolerance is narrowed to $\frac{1}{3}(=(1-0.8)/(1-0.4))$.

In the above calculation, it is assumed that the polarization modulation layer 131, 132 and the phase modulation layer 133, 134 are provided completely in the same plane. However, in fact, the structure shown in part (a) of FIG. 4, wherein these layers are stacked, is generally adopted. In this case, the dip intensity further decreases due to the effect of Fresnel diffraction occurring between the layers. Consequently, the exposure amount tolerance further decreases.

FIG. 5 shows a case where a gap of 0.2 μm, which is a converted value in air (0.3 μm in a substance with a refractive index of 1.5), is present between the polarization modulation layer 131, 132 and the phase modulation layer 133, 134. FIG. 5 shows a calculation result of the intensity of transmissive light in the case where such a gap is present. In this case, the light intensity at the dip part 136 decreases to 0.3, and the exposure amount tolerance becomes still narrower.

The problem with the phase conflict part, as shown in FIGS. 4 and 5, has been explained above. The above-described dip part inevitably occurs at the boundary between two polarization modulation regions, regardless of the presence/absence of a phase stepped part.

BRIEF SUMMARY OF THE INVENTION

The present invention has been made in consideration of the above-described problem. The object of the invention is to provide a photomask with an increased exposure amount tolerance, wherein an amplitude modulation region is provided at a specific part, in addition to a polarization modulation region and a phase modulation region, whereby the light transmissivity in a background part is decreased and, as a result, a dip intensity is approached to 1.

According to an embodiment of the present invention, there is provided a photomask for use in an exposure apparatus which forms an exposure pattern by illumination, comprising: at least two polarization modulation regions which produce mutually incoherent polarized light components and adjoin each other; at least two phase modulation regions which impart a phase difference of 180° and adjoin each other; and amplitude modulation regions which decrease transmittance, wherein a contact line between the two polarization modulation regions and a contact line between the two phase modulation regions are located at a corresponding position in a direction of illumination, and the amplitude modulation regions are provided on both sides of the corresponding position, with a predetermined distance from the corresponding position.

According to another embodiment of the invention, there is provided a photomask for use in an exposure apparatus which forms an exposure pattern by illumination, comprising: at least two polarization modulation regions which produce mutually incoherent polarized light components and adjoin each other; and amplitude modulation regions which decrease transmittance with respect to illumination light, wherein the amplitude modulation regions are provided on both sides of a contact line between the two polarization modulation regions, with a predetermined distance from the contact line.

According to still another embodiment of the invention, there is provided a photomask having a plurality of modulation functions with respect to incident light, comprising: a boundary between polarization modulation regions and a boundary between phase modulation regions, which are provided on the same optical path of the incident light; and amplitude modulation means for generating such a transmittance distribution that a transmittance of the incident light is high on the optical path at the boundary between the phase modulation regions and the boundary between the polarization modulation regions, and a transmittance of other incident light is low at a position that is away by a predetermined distance from the optical path at the boundary between the phase modulation regions and the boundary between the polarization modulation regions.

According to still another embodiment of the invention, there is provided a phase shift mask which is used in an exposure apparatus that forms an exposure pattern by illumination, and includes at least two polarization modulation regions that adjoin each other, wherein an amplitude modulation region for decreasing a transmittance of illumination light is provided at a predetermined region of the phase shift mask.

According to another embodiment of the invention, there is provided an exposure apparatus comprising: a light source which emits light for exposure; a photomask provided on an optical path from the light source; and a projection optical system provided on a transmissive light path of the photomask, wherein the photomask includes: a boundary between polarization modulation regions and a boundary between phase modulation regions, which are provided on the same optical axis of light from the light source, and amplitude modulation means for generating such a transmittance distribution that a transmittance of incident light is high on an optical path at the boundary between the phase modulation regions and the boundary between the polarization modulation regions, and a transmittance of other incident light is low at a position that is away by a predetermined distance from the optical path at the boundary between the phase modulation regions and the boundary between the polarization modulation regions.

According to these embodiments, photomasks with a large exposure amount tolerance can be provided.

Figure 1:
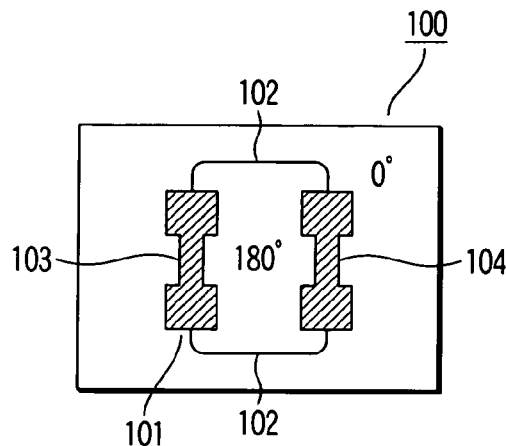
FIG. 1 shows an example of a phase shift mask (Shibuya-Levenson mask)
Figure 2:
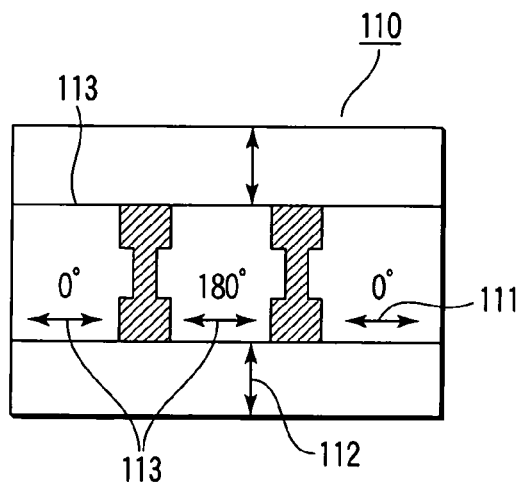
FIG. 2 shows an example of a polarized phase shift mask.
Figure 3A:
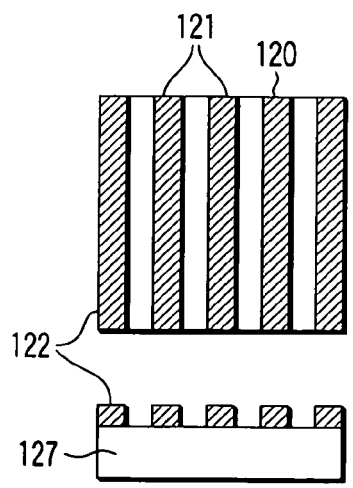
FIG. 3A to FIG. 3C show an example of a mask having an electrical conductor lattice with polarization characteristics.
Figure 3B:
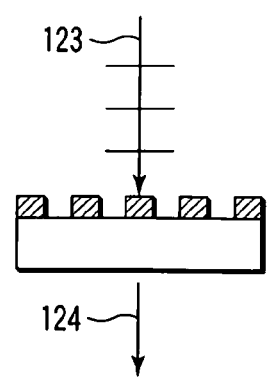
Figure 3C:
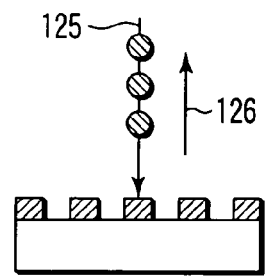
Figure 4:
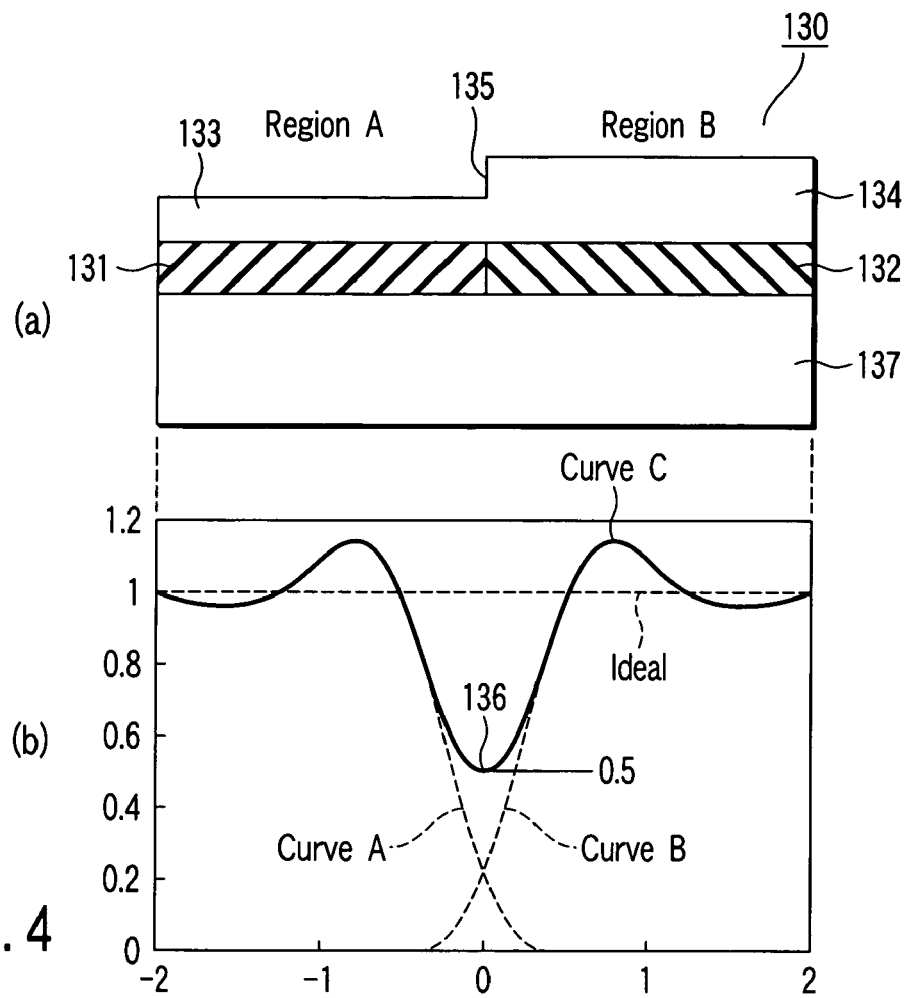
Figure 5:
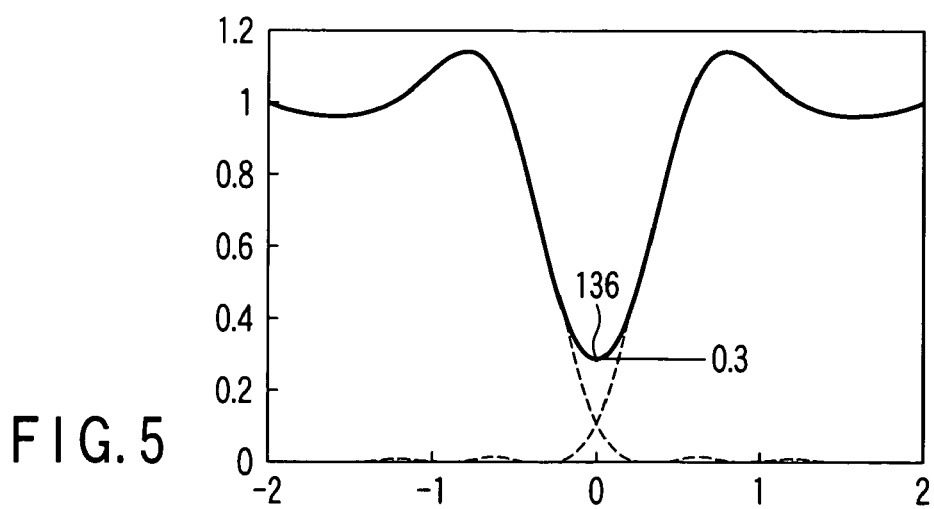
Figure 6:
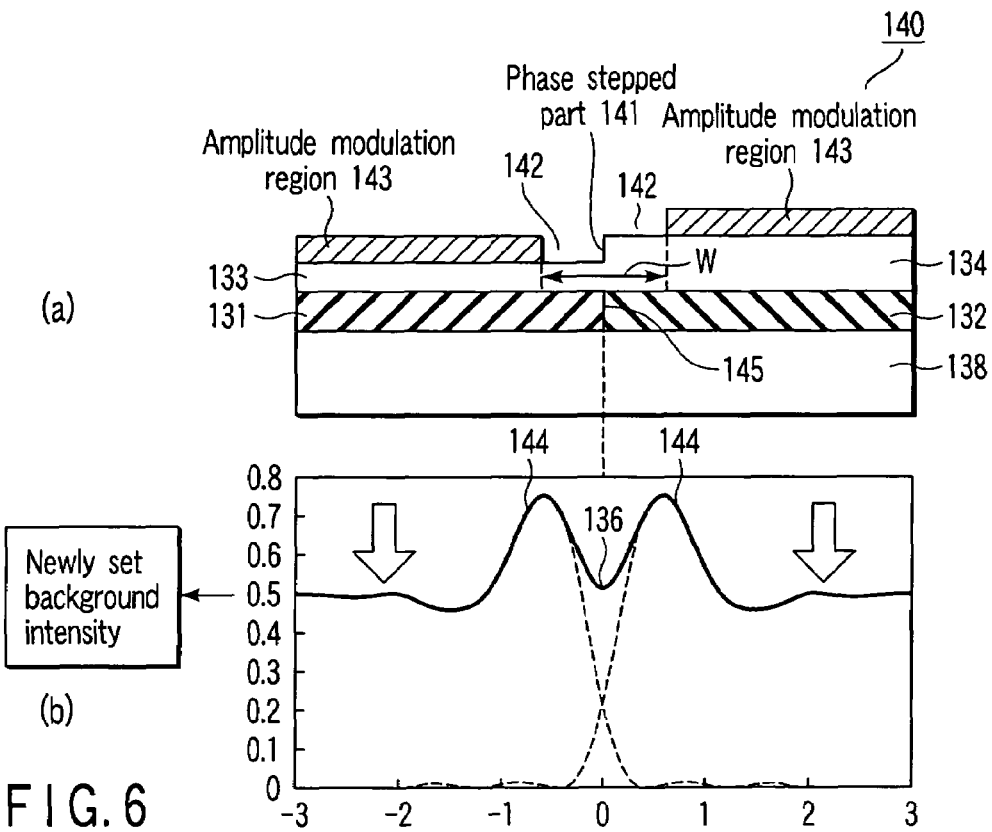
Figure 7:
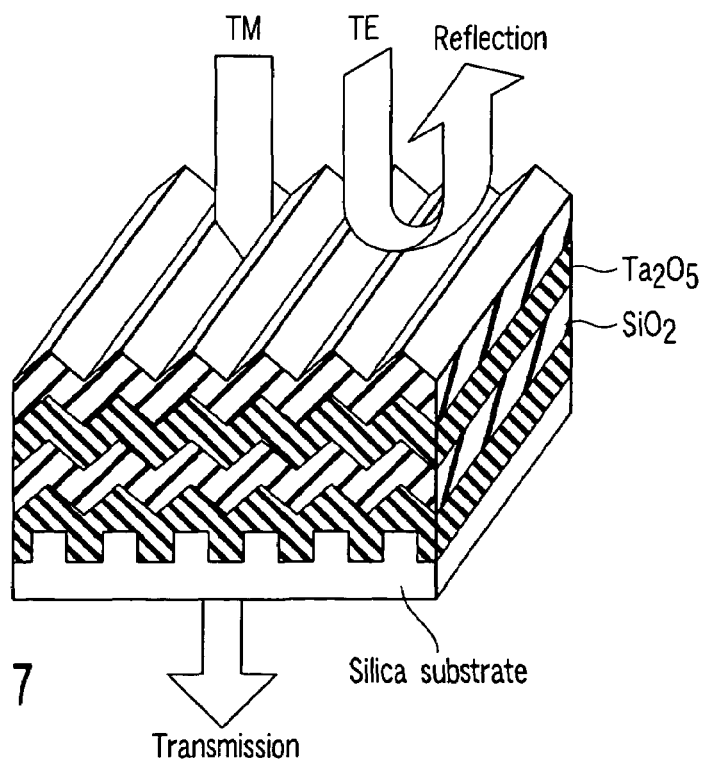
Figures 9A, 9B:
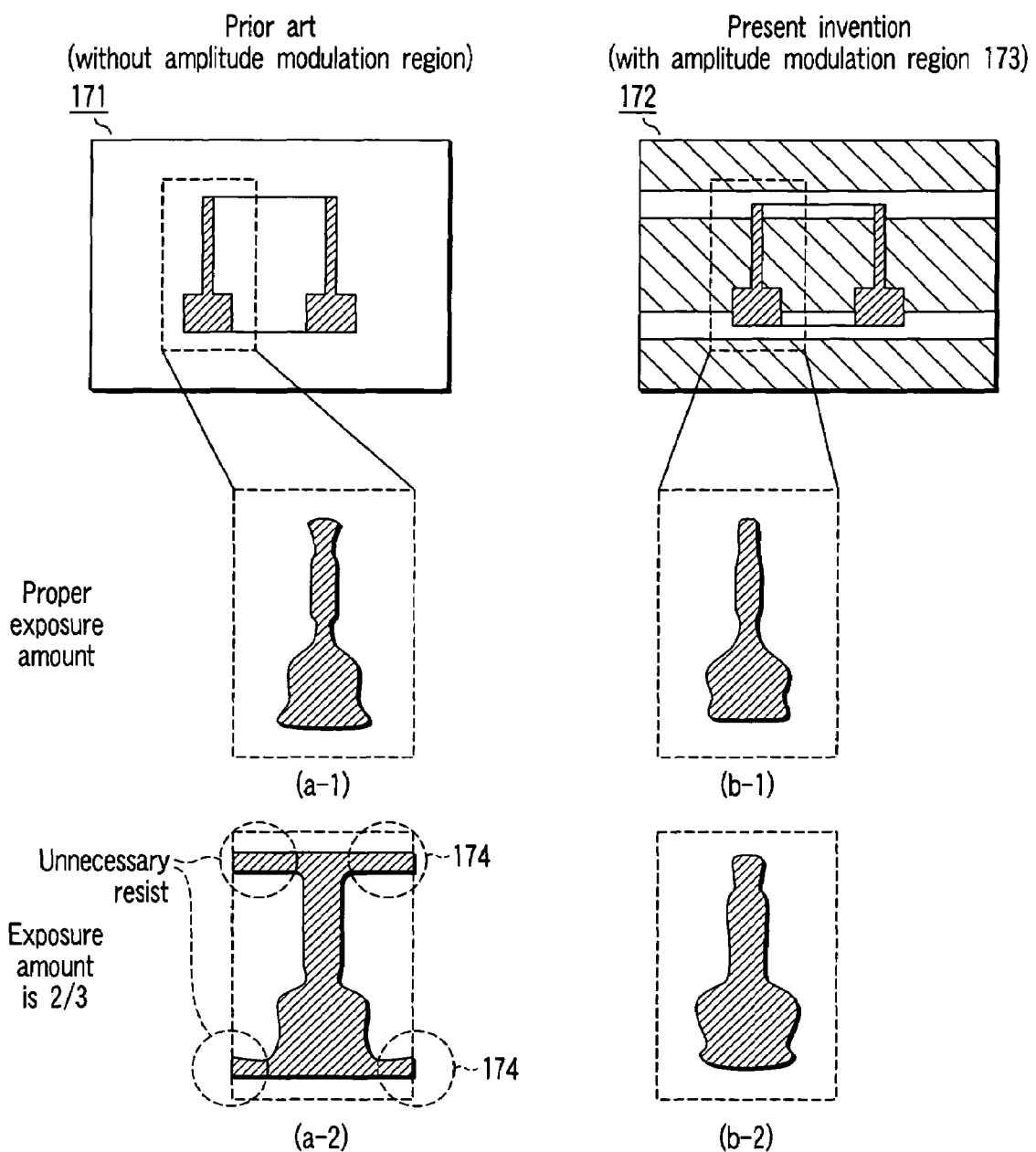
Figures 11A, 11B:
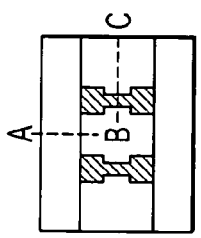
Figure 13:
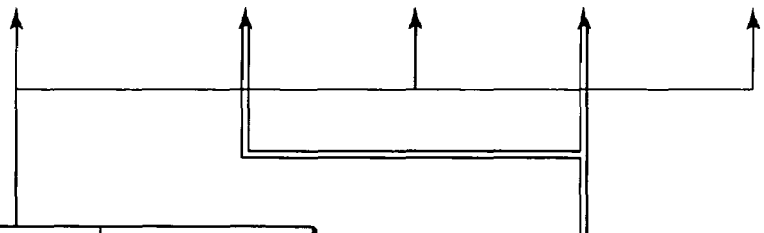
Figure 15A:
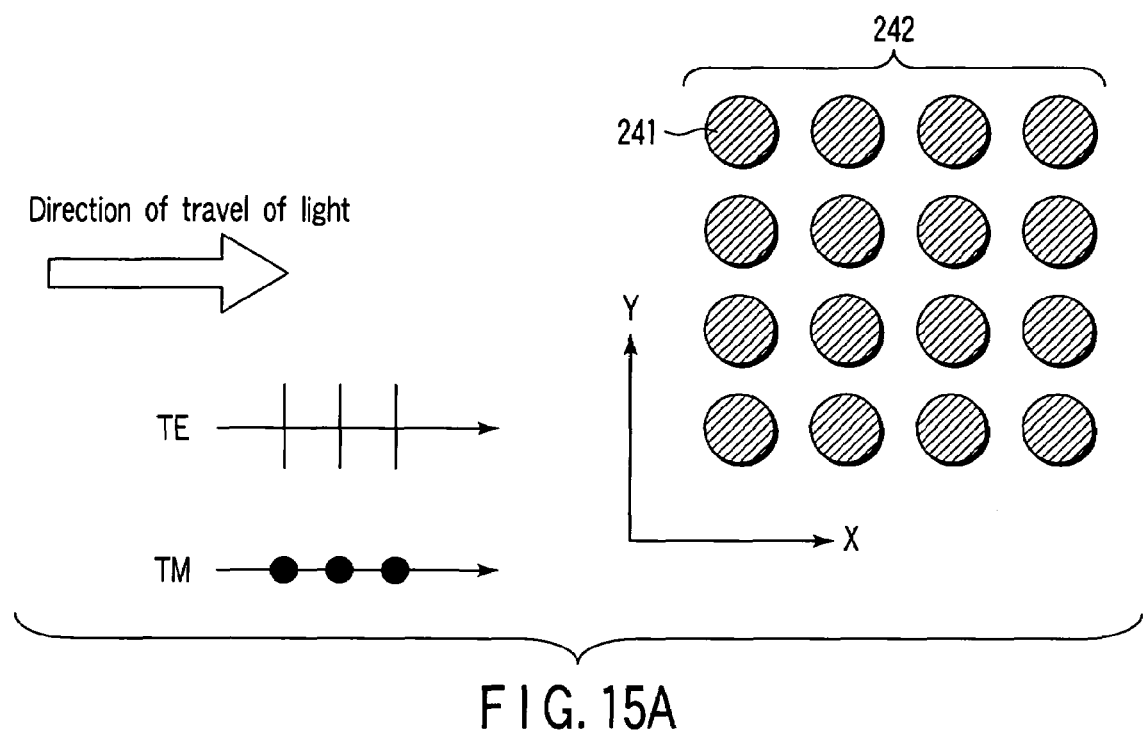
Figure 15B:
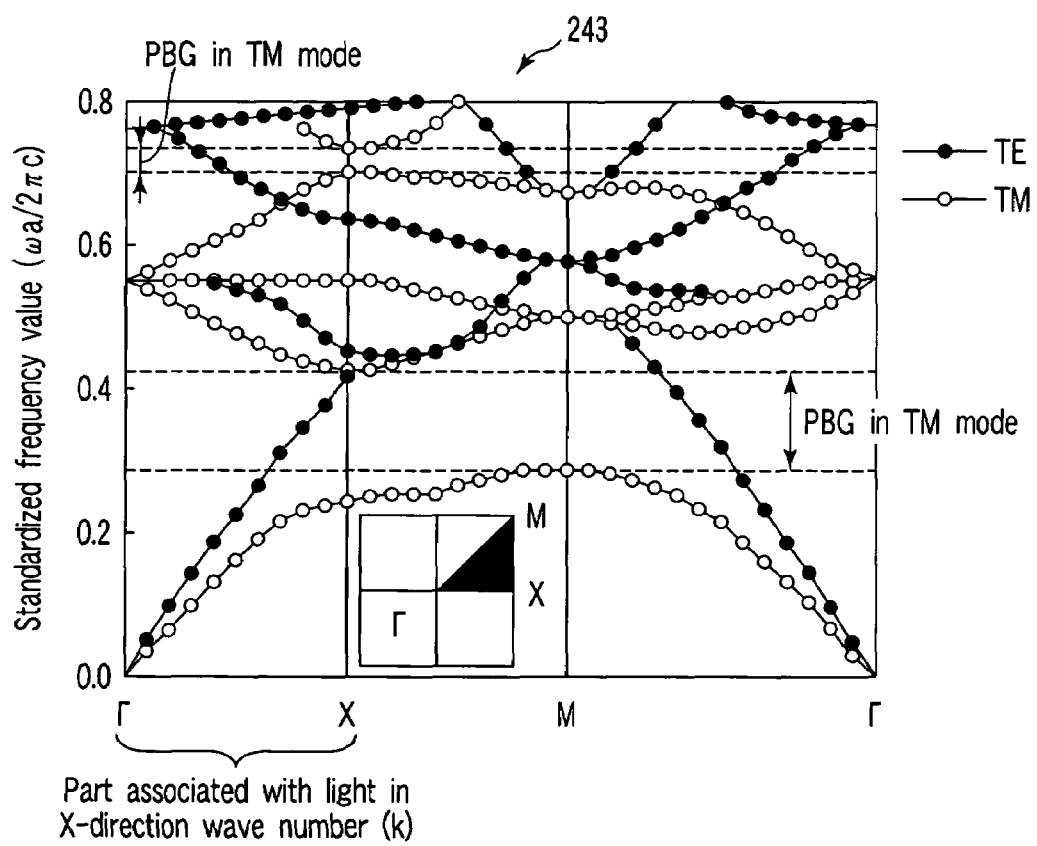
Figure 16:
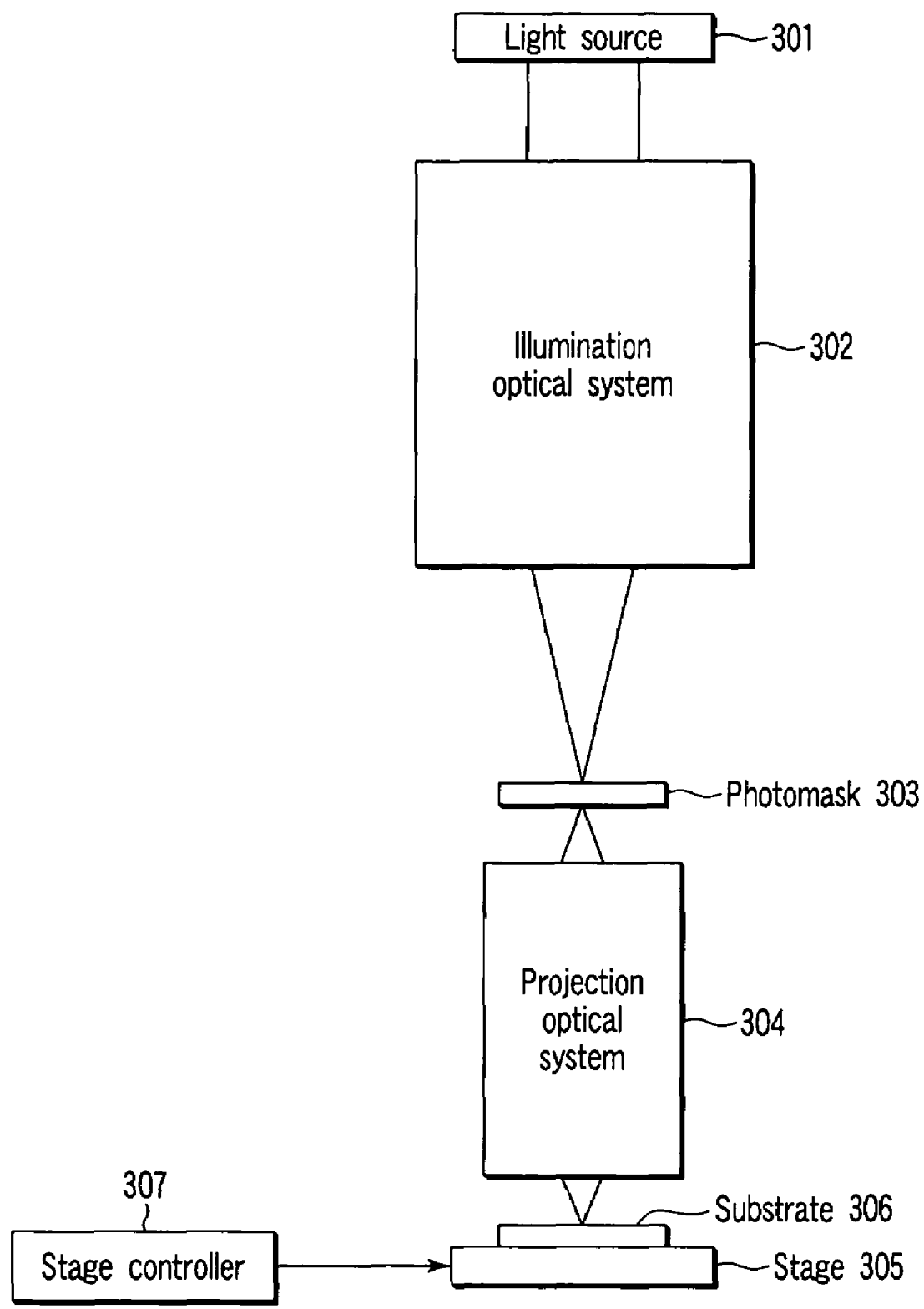

Part (a) of FIG. 4 is a cross-sectional view of a polarized phase shift mask, and part (b) of FIG. 4 shows, for understanding of the principle of the present invention, a calculation result of a light intensity distribution of transmissive light at a part of the mask, where a phase conflict is to be eliminated;

FIG. 5 shows a calculation result of the intensity of transmissive light in a case where a gap of 0.2 μm, which is a converted value in air, is present between a polarization modulation layer and a phase modulation layer;

Part (a) of FIG. 6 shows a basic structure of a photomask according to the present invention, and part (b) of FIG. 6 shows a light intensity distribution of transmissive light;

FIG. 7 shows an example of a photonic crystal that is formed by a self-cloning method;

FIG. 8A to FIG. 8E show a specific example in which a photonic crystal is used for a polarization modulation element;

FIG. 9A shows a resist pattern, which is obtained by exposure and patterning using a conventional mask having no amplitude modulation layer;

FIG. 9B is a comparative view of a resist pattern, which is obtained by exposure and patterning using a mask of the present invention having amplitude modulation layers;

FIG. 10A to FIG. 10E show a specific example in which a grid polarizer is formed as a polarization modulation element;

FIG. 11A and FIG. 11B show examples of various structures, which are applicable in implementing the present invention, wherein at least two phase modulation regions and at least two polarization modulation regions are provided;

FIG. 12 shows a mask, which is applicable in implementing the present invention, wherein two birefringence elements are patterned;

FIG. 13 shows combinations of polarization states of incident light to two birefringence elements and emission light from the two birefringence elements;

FIG. 14A shows an example of a structural birefringence element, which is applicable in implementing the present invention, wherein a plurality of parallel lattices 232 are formed;

FIG. 14B and FIG. 14C show incidence states of linearly polarized light to the structural birefringence element shown in FIG. 14A;

FIG. 15A shows a structure of a two-dimensional square lattice photonic crystal 2, which is formed of dielectric circular rods and is applicable in implementing the present invention;

FIG. 15B shows a photonic band structure of FIG. 15A (a graph with an abscissa indicating a wave number and an ordinate indicating a standardized frequency value $\omega a/2\pi c$); and FIG. 16 is a schematic view for describing a specific example of an exposure device according to the present invention.

DETAILED DESCRIPTION OF THE INVENTION

The inventors have paid attention to the fact that a light intensity distribution in a photomask can be varied by forming an amplitude modulation pattern which partly modulates the intensity of transmissive light in the photomask. Making use of this effect, the dip intensity can be made closer to 1.

FIG. 6 shows an example of the basic structure of a photomask 140 according to the present invention. At least two kinds of polarization modulation layers 131 and 132, which have different directions of modulation of light, are formed on a surface of a transparent mask substrate 138. At least two kinds of phase modulation layers 133 and 134, which have different thicknesses corresponding to a phase difference of 180° relative to the wavelength of radiation light, are provided on the polarization modulation layers 131 and 132, thereby forming a phase shift section. Accordingly, a phase stepped part 141 is formed at a boundary between the phase modulation lasers 133 and 134. A boundary part 145 between the two kinds of polarization modulation layers 131 and 132 corresponds in position on a mask pattern to the phase stepped part 141 at the boundary between the two phase modulation lasers 133 and 134.

In the structure shown in FIG. 6, amplitude modulation regions 143 having an amplitude modulation function for decreasing the intensity of transmissive light are provided on a part excluding a vicinity 142 of the phase stepped part 141, preferably on the entire region excluding the vicinity 142. Specifically, the amplitude modulation regions 143 are provided on regions on both sides of the phase stepped part 141 (and boundary part 145), spaced apart by a predetermined distance from the phase stepped part 141. A width w of a part, where the amplitude modulation regions 143 are not provided, is chosen on the basis of the waveforms of a curve A and a curve B in part (b) of FIG. 4 and a necessary exposure amount tolerance. Preferably, the distance from the optical path at the boundary between the phase modulation regions and the boundary between the polarization modulation regions should be 0.61 λ/NA to 2.44 λ/NA. Normally, the distance is set at λ/NA (λ is the wavelength of illumination light, and NA is the numerical aperture of the projection optical system).

With this structure, the transmissive light intensity (i.e. background intensity) of the parts, other than the boundary part, that is, other than the phase stepped part 141, can be decreased by a predetermined value, while the value of the dip intensity is being kept unchanged. By the decrease in light intensity, the dip intensity can be relatively increased. Although two wave crests appear on both sides of the dip part 136 in the intensity distribution, no pattern to be formed is present at these positions in usual cases, so there is no problem in exposure process.

For example, in the case of the ideal structure in which there is no distance between the polarization modulation layer 131, 132 and the phase modulation layer 133, 134, the dip intensity is 0.5. Thus, if the value of the amplitude modulation is set at 50% in accordance with the dip intensity of 0.5, a new dip intensity preferably becomes 1. However, in fact, the dip intensity decreases in accordance with the distance between the polarization modulation layer 131, 132 and the phase modulation layer 133, 134. It is thus desirable to decrease, in accordance with the decrease in dip intensity, the value of amplitude modulation to less than 50%, for instance, to the value of the dip intensity (in the example of FIG. 5, it is preferable to set the amplitude modulation to 30% since the dip intensity is 0.3).

In the mask part in FIG. 6, the phase modulation layers 133 and 134 having the phase stepped part 141 (phase modulation shift part) are formed. However, there are some locations where the boundary part (polarization modulation shift part) between the polarization modulation regions 131 and 132 is present but the phase stepped part 141 is not present. It is desirable that the present structural parts, i.e. the amplitude modulation regions 143, be provided at the boundary part 145 between the polarization modulation regions 131 and 132 even in the mask part without the phase stepped part.

The polarization modulation region is a region for changing the polarization state of incident light. The amplitude modulation region is a region for decreasing the light intensity of incident light. The phase modulation region is a region for varying the phase of incident light.

From the above-described results, the photomask is a mask including the polarization modulation shift part and phase modulation shift part, which are provided on the same optical path relative to the incident light, and the amplitude modulation means which has a high transmittance of the incident light on the optical path of the phase modulation shift part and polarization modulation shift part, and has a low transmittance of other incident light at a predetermined distance from the optical path of the phase modulation shift part and polarization modulation shift part. It should suffice if this photomask includes the polarization modulation shift part, phase modulation shift part and amplitude modulation means for incident light.

EXAMPLE 1

Referring to FIG. 7 and FIGS. 8A to 8E, a description is given of an example of the invention in which a photomask is formed using a photonic crystal as a polarization modulation element.

(1) Formation of Photonic Crystal

There have been proposed some methods of fabricating photonic crystals. For instance, a method in which holes are formed in the surface of a dielectric block by means of a drill, etc., is disclosed in E. Yablonovitch, T. J. Gmitter and K. M. Leung: Phys. Rev. Lett. 67 (1991) 2295. A method in which a great number of dielectric rods are formed by chemical etching and these rods are stacked is disclosed in E. Ozbay, E. Michle, G. Tuttle, R. Biswas, M. Sigalas and K.-M. Ho: Appl. Phys. Lett. 64 (1994) 2059. As disclosed in S. Kawakami, T. Kawashima and T. Sato: Phys. Lett. 74 (1999) 463, there is proposed a self-cloning method in which multiple layers are stacked while an uneven surface pattern on a substrate is being maintained. Besides, there is a method in which multiphoton absorption is used, as disclosed in H.-B. Sun, S. Matsuo and H. Misawa: Opt. Rev. 6 (1999) 396, and there is a method using holography technology in which a periodic structure is described and fixed in a dielectric body, thus forming a photonic crystal. In Example 1, polarization modulation regions are formed using the self-cloning method. In the fabrication method using self-cloning, a plurality of V-shaped thin films are successively stacked, thereby realizing a photonic crystal. The self-cloning method is a method in which a transparent substrate having recesses and projections on its surface is formed and two kinds of thin films are alternately provided on the transparent substrate by sputtering, thereby producing a periodic structure.

FIG. 7 shows an example of the photonic crystal that is formed by the self-cloning method. A recess-and-projection pattern is formed on a mask substrate of synthetic silica by a lithography etching process. Then, films are formed by a bias sputtering method using Si and Ta as target material. In this case, Ar is introduced as sputter gas and oxygen is introduced as reactive gas. By a reactive sputtering method, $SiO_2$ and $Ta_2O_5$ are alternately stacked on the recess-and-projection surface. In this manner, as shown in FIG. 7, a photonic crystal having a V-shaped multi-layer structure is formed.

According to this method, conventional lithography techniques and film formation techniques can be applied to the fabrication of photonic crystals. In addition, since there is no need to use special materials, fabrication is easy. Moreover, the polarizing function can be obtained by patterning the initial recess-and-projection substrate. A method of realizing a linear polarization function by this process is described in Kawakami, Otera, and Kawashima, "Fabrication of Photonic Crystal and Application to Optical Devices", Applied Physics, Vol. 68, No. 12 (1999).

Figure 8A:
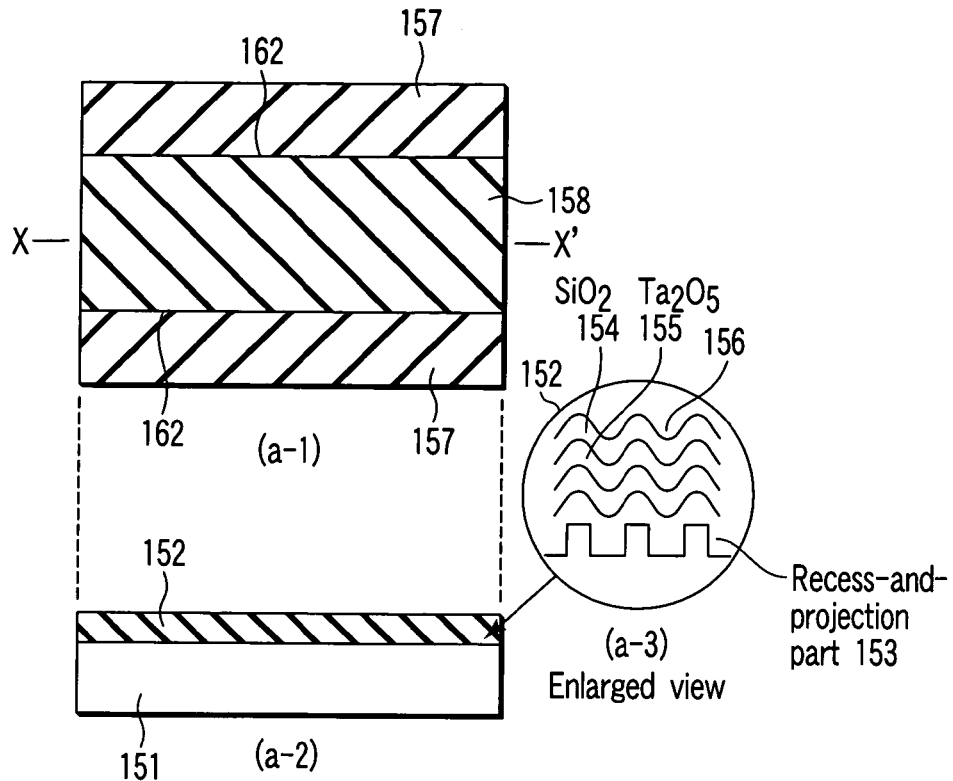

A description is given of an example in which a photomask of the present invention is formed using a photonic crystal as a polarization modulation element. To start with, as shown in part (a-1) of FIG. 8A, a photonic crystal region 152, which functions as a polarization modulation layer, is formed on a surface of a transparent substrate 151, e.g. a silica substrate or a glass substrate. Part (a-1) of FIG. 8A is a plan view, and part (a-2) of FIG. 8A is a cross-sectional view taken along line X-X'. A recess-and-projection portion 153, as shown in part (a-3) of FIG. 8A that is an enlarged view of the photonic crystal layer 152, is formed on the surface of the transparent substrate 151 by photolithography. In this example, the pitch (width of lateral repetition) of the recess-and-projection portion 153 is set at 130 nm and the depth thereof is set at 65 nm.

Ten $SiO_2$ layers 154 and ten $Ta_2O_5$ layers 155, each having a thickness of 55 nm, are alternately formed on the recess-and-projection portion by a film formation process such as sputtering. A partial enlarged view (a-3) of part (a-2) of FIG. 8A shows, in enlarged scale, the recess-and-projection portion and the formed films. In this film formation process, in particular, an RF bias sputtering process, which applies radio-frequency power to the transparent substrate 151, may be used to form layers 154, 155 each having a V-shaped recess-and-projection pattern 156.

In part (a-1) of FIG. 8A, horizontal lines 157 and vertical lines 158 schematically indicate directions of extension of V-shaped structures. Part (a-1) of FIG. 8A shows that patterning is performed to form two kinds of regions, i.e. polarization modulation regions, whose directions of modulation of radiation light, i.e. axes of polarization, are different by 90°.

(2) Formation of Phase Shift Layer

Then, for example, an $SiO_2$ layer 159 with a thickness of, e.g. 800 nm is formed by a PE-CVD method (Plasma Enhanced Chemical Vapor Deposition Method), thereby to form a phase shift layer on the photonic crystal region 152 that constitutes the polarization modulation region. In this film formation process, it is preferable to choose such a film formation condition as to effect surface planarization, so that the V-shaped recess-and-projection pattern 156 on the surface of the photonic crystal 152 may not appear on the $SiO_2$ layer 159.

Figure 8B:
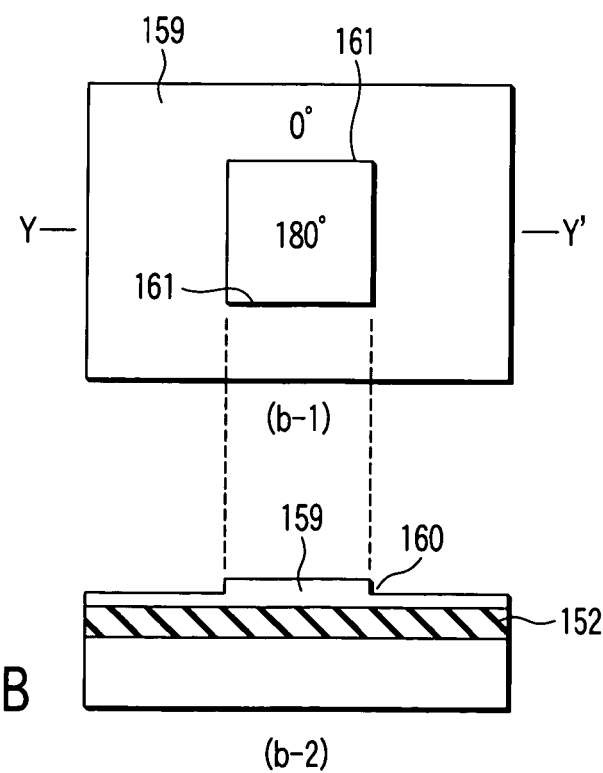

The formation of the $SiO_2$ layer 159 is followed by ordinary resist coating, patterning and dry etching. A stepped portion 160 of 397 nm is formed to impart a phase difference of 180° in the $SiO_2$ layer 159 with respect to light of a wavelength of, e.g. 365 nm, which is used for exposure. In this case, horizontal phase shift lines 161 in part (b-1) of FIG. 8B are made to agree with boundaries 162 between the two regions of the photonic crystal, which are shown in part (a-1) of FIG. 8A. Part (b-2) of FIG. 8B is a cross-sectional view of the formed phase shift layer, taken along line Y-Y' in part (b-1) of FIG. 8B.

(3) Formation of Light-Shield Layer

Figure 8C:
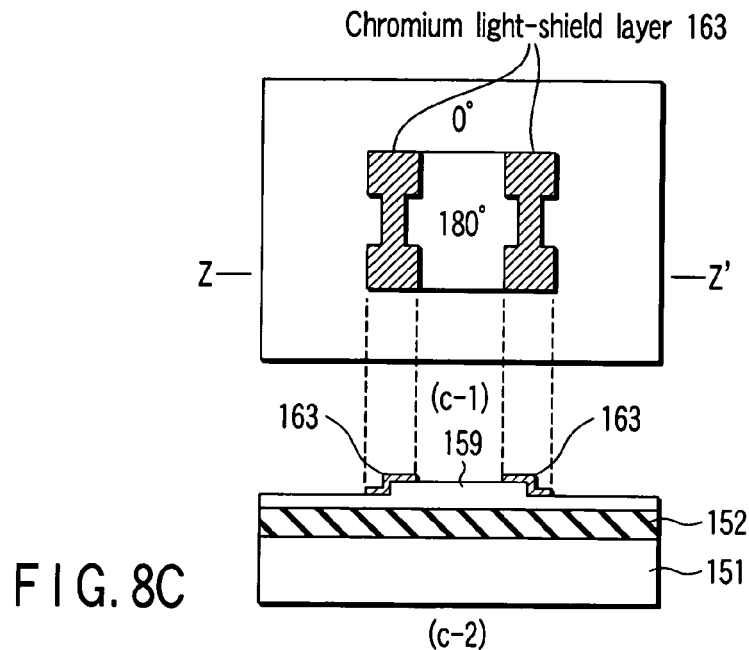

Subsequently, a light-shield layer, which constitutes a mask pattern, is formed. To begin with, a light-shield film, e.g. a chromium thin film, is formed by sputtering with a thickness of, e.g. 800 nm, which can completely block radiation light. Then, steps of resist coating, patterning and dry etching are carried out to form a chromium light-shield layer 163 having a predetermined mask pattern. Parts (c-1) and (c-2) of FIG. 8C show the formed light-shield layer 163. Examples of the usable material of the light-shield layer include, aside from chromium, metals such as gold, silver and aluminum. Part (c-2) of FIG. 8C is a cross-sectional view of the mask with the formed light-shield layer, taken along line Z-Z' in part (c-1) of FIG. 8C.

(4) Formation of Amplitude Modulation Layer

Figure 8D:
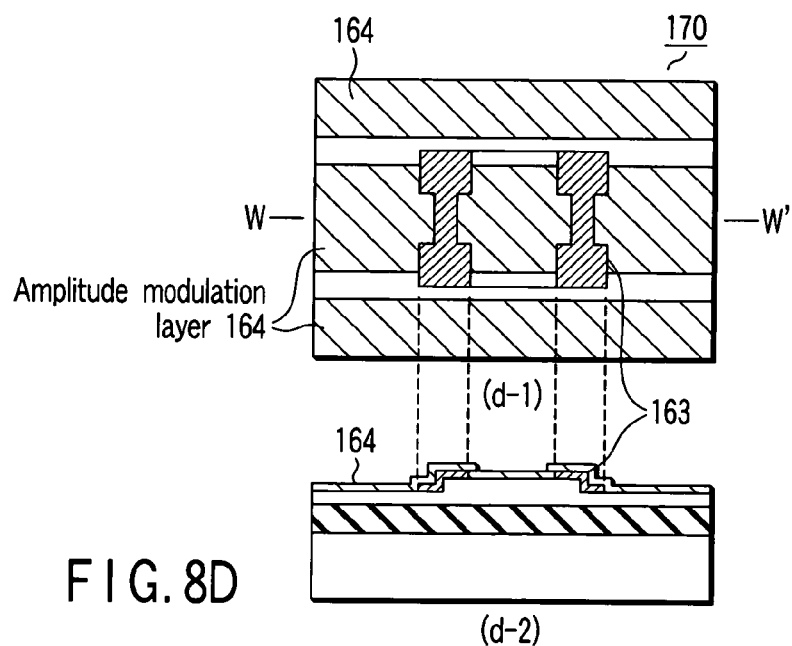

Subsequently, an amplitude modulation layer is formed on the mask on which the light-shield layer is formed. For example, a chromium thin layer with a thickness of 6 nm is formed by sputtering. With the thickness of 6 nm, the transmittance of radiation light having a wavelength of 365 nm is reduced to 50%. Then, lithography steps including resist coating, patterning and dry etching are performed to form a chromium amplitude modulation layer 164. In the etching step, the chromium 163 of the light-shield layer is present immediately below the chromium 164 of the amplitude modulation layer. However, both are greatly different in thickness and the transmittance hardly varies (substantially 0%) even if the thickness of the light-shield layer 163 slightly varies. Thus, no problem arises if a proper etching condition is chosen. Part (d-1) of FIG. 8D is a plan view of the formed mask. Part (d-2) of FIG. 8D is a cross-sectional view taken along line W-W' in part (d-1) of FIG. 8D.

Figure 8E:
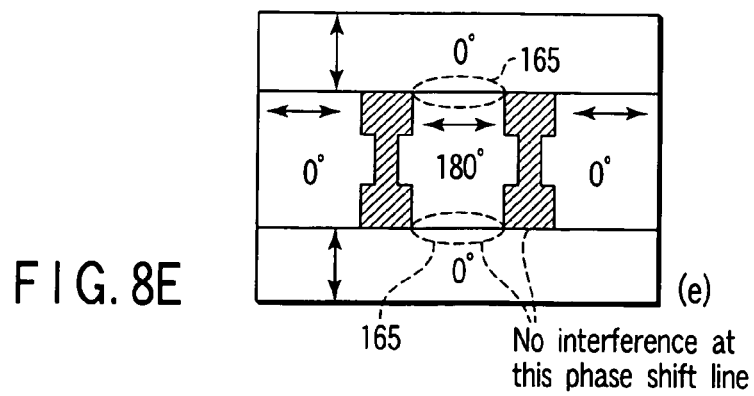

FIG. 8E shows mutually perpendicular polarization directions (indicated by arrows "←→") of the two polarization modulation layers, and phase differences (0° and 180°) that are provided by the phase shift layer. Boundaries 165 at the central part are stepped parts where phase differences are caused by the phase shift layer. However, since two neighboring polarization modulation layers are formed immediately below, no interference occurs.

(5) Exposure

FIG. 9A and FIG. 9B show an example in which a resist pattern is formed by random polarized illumination light using the polarized phase shift mask that is formed in the above-described manner. For the purpose of comparison, an example of exposure using a photomask without an amplitude modulation layer, that is, a conventional photomask, is also shown.

In FIG. 9A and FIG. 9B, a conventional mask 171 without an amplitude modulation layer and a mask 172 with an amplitude modulation layer 173 according to the present invention are used. Parts (a-1), (b-1), (a-2) and (b-2) of FIGS. 9A and 9B show resist patterns that are formed by exposure and patterning using these masks.

As is shown in part (a-1) of FIG. 9A and part (b-1) of FIG. 9B, a phenomenon of non-removal of resist is not observed in both cases when exposure is performed with a proper exposure amount ((a-1), (b-1)). However, when the exposure amount is decreased from the optimal value to ⅔ of the optimal value, a non-removed resist part 174 occurred in the case of the conventional photomask ((a-2)). On the other hand, when the polarized phase shift mask 172 according to the present invention is used, no remaining resist part occurred ((b-2)). In other words, a great tolerance of exposure amount was confirmed.

EXAMPLE 2

Next, referring to FIG. 10A to FIG. 10E, a description is given of an example in which a grid polarizer is used as the polarization modulation element.

(1) Formation of Polarization Modulation Layer (Grid Polarizer)

As shown in part (a-2) of FIG. 10A, a metal thin film for forming a lattice pattern, e.g. a chromium film 182, is formed on a surface of a silica substrate 181 by sputtering under ordinary sputtering conditions. The metal material is not limited to chromium. Then, by an ordinary method for use in microfabrication, a resist is coated and patterned, and the chromium film is subjected to dry etching. Thereby, grid lattices 183 and 184 of chromium thin films, which extend perpendicular to each other, are formed.

The thickness of the chromium film 182 which constitutes the grid lattices is set at 50 nm. The lattice pattern of each of the two mutually perpendicular grid lattices 183 and 184 is a line & space pattern of 50 nm/50 nm. A proper pitch of the lattice pattern is about 1/10 to 1/5 of the wavelength of light used. Line patterns 185 and 186 shown in part (a-1) of FIG. 10A schematically indicate directions of two kinds of lattices. Part (a-1) of FIG. 10A shows an example in which two kinds of regions with different axes are patterned. The fabrication steps for forming two phase modulation regions and amplitude modulation regions are substantially the same as in Example 1.

(2) Formation of Phase Shift Layer

Then, for example, an $SiO_2$ layer 187 with a thickness of, e.g. 800 nm is formed by a PE-CVD method (Plasma Enhanced Chemical Vapor Deposition Method) on the grid lattices 183 and 184. In this film formation process, like Example 1, such a film formation condition is chosen that the recess-and-projection pattern on the grid lattices 183 and 184 may not appear on the $SiO_2$ layer 187.

Then, using ordinary lithography techniques, a resist is coated on the $SiO_2$ layer, and the resist is patterned and dry-etched. Thus, a stepped portion 188 of 397 nm is formed to impart a phase difference of 180° with respect to light of a wavelength of, e.g. 365 nm. In this case, horizontal phase shift lines 189 in part (b-1) of FIG. 10B are made to agree with boundaries 190 between the two regions of the grid polarizers 183 and 184 shown in part (a-1) of FIG. 10A. Parts (b-1) and (b-2) of FIG. 10B show a structure in which two phase modulation regions are formed on the grid polarizers 183 and 184.

(3) Formation of Light-Shield Layer

Figure 10C:
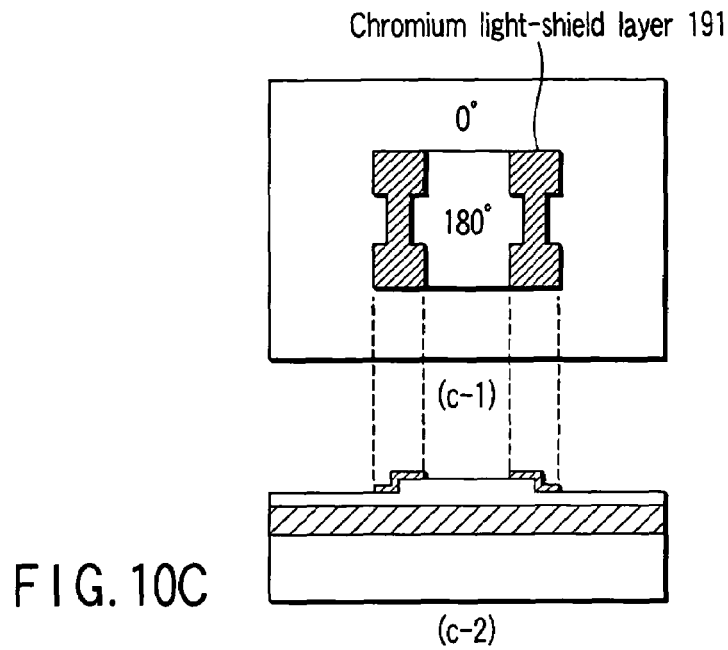

Subsequently, for example, a chromium thin film is formed by sputtering with a thickness of, e.g. 800 nm, on the phase modulation regions. Then, using ordinary lithography, a resist is coated on the chromium layer, and the resist is patterned and dry-etched. Thus, a chromium light-shield layer 191 is formed. Parts (c-1) and (c-2) of FIG. 10C show the formed light-shield layer.

(4) Formation of Amplitude Modulation Layer

Figure 10D:
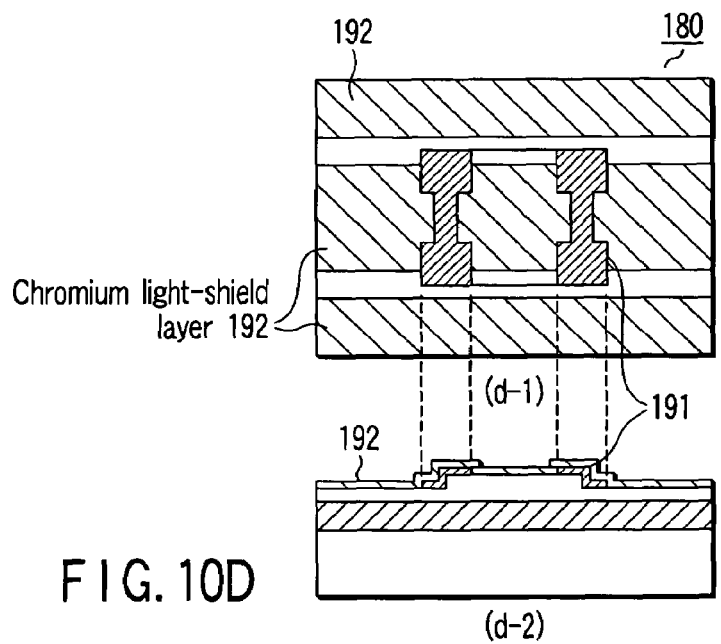

Subsequently, in order to form an amplitude modulation layer, a chromium thin layer with a thickness of 6 nm, for example, is formed by sputtering (transmittance: 50%). A resist is coated on the chromium thin layer and is subjected to ordinary patterning and dry etching, thus forming a chromium amplitude modulation layer 192. The chromium light-shield layer 191 is formed immediately under the chromium thin film of the amplitude modulation layer 192. However, both are greatly different in thickness and the transmittance hardly varies (substantially 0%) even if the thickness of the light-shield layer 191 slightly varies in the subsequent etching step. Thus, no problem arises if a proper etching condition is chosen in the etching step. Parts (d-1) and (d-2) of FIG. 10D show the formed mask.

Figure 10E:
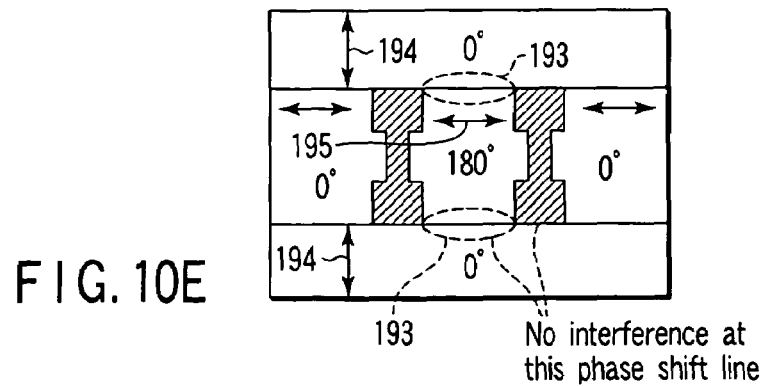

As shown in FIG. 10E, the directions of linearly polarized light emerging from the two polarization modulation layers 194 and 195 are perpendicular to each other. Thus, even if the phase difference at boundary parts 193, which is provided by the phase shift, is 180°, no interference occurs at the phase shift lines.

(5) Exposure

A resist pattern was formed by random polarized illumination light using the polarized phase shift mask 180 that is formed in the above-described manner. For the purpose of comparison, a resist pattern was formed using a photomask without an amplitude modulation layer, that is, a conventional photomask.

As a result, it was found that even when the exposure amount is decreased from the optimal value, no remaining resist part occurred, as in Example 1 using the photonic crystal as the polarization modulation element. In short, a great tolerance of exposure amount was confirmed.

EXAMPLE 3

FIG. 11 shows structure types A to D which are usable in implementing the present invention, wherein at least two phase modulation regions 201, 202, at least two polarization modulation regions 203, 204 and a light-shield layer 206 are provided. Amplitude modulation regions are formed as shown in parts (d-1) and (d-2) of FIG. 8D, but depiction thereof is omitted. In part (b) of FIG. 11, polarization states (i.e. polarization directions) of transmissive light emerging from the polarization modulation regions of the mask are indicated by double-headed arrows (←→). In each of types A to D, linearly polarized lights, which are perpendicular to each other, are produced. The states of phase shift of transmissive light are indicated by 0° and 180°. The phase of 0° means that the phase of the associated part is a reference phase. In part (b) of FIG. 11, each cross-sectional view (A-B-C) is taken along line A-B-C in a plan view of part (a) of FIG. 11. The structure types A to D include all states of light, which are required for the polarized phase shift mask. Desired patterns can be formed by implementing these structure types.

In type A in part (b) of FIG. 11, two phase modulation regions 201 and 202 having stepped parts are formed to constitute a phase shift layer. Two polarization modulation regions 203 and 204, which are composed of linear polarizers, are formed to constitute a polarization modulation layer. A light-shield layer 206 is formed at a shoulder 205 of the phase modulation region 202. Depiction of amplitude modulation layers is omitted. Non-polarized random light is used as incident light.

In type B in part (b) of FIG. 11, the layer structure of a phase shift layer 207 is provided only in a region of 180°. Two polarization modulation regions 203 and 204 are the same as in type A of FIG. 11. The order of stacking of the light-shield layer 208, phase shift layer 207 and linear polarizers 203, 204 may be changed.

In type C in part (b) of FIG. 11, no special phase modulation layer is provided. A phase shift part 212 is formed of a polarization modulation material 210. Type C includes two polarization modulation regions 209 and 210. A stepped part 212 for imparting a phase difference to transmissive light is formed at one of the polarization modulation regions, 210. In other words, the linear polarizer 210, which forms the polarization modulation region, also realizes phase shift. Type C includes a light-shield layer 213 which is formed at the stepped part 212 of the polarization modulation region 210. Amplitude modulation layers are formed as shown in FIG. 8D, but depiction thereof is omitted.

In type D in part (b) of FIG. 11, the linear polarizers 203 and 204 of type B in part (b) of FIG. 11 are replaced with two birefringence elements 214 and 215 having polarization modulation functions. Polarized light, which is polarized in a predetermined fashion, is used as incident light. In types A to C in part (b) of FIG. 11, random incident light is converted to mutually perpendicular linear polarized lights. On the other hand, in type D, specific polarized light is made incident and converted to mutually perpendicular polarized lights. The polarizing function in this case is explained with reference to FIG. 12.

FIG. 12 shows a mask including a birefringence element 221 as a layer having a polarization modulation function. The birefringence element 221, which is formed of, e.g. a structural birefringence element or a photonic crystal, is provided on a transparent synthetic silica plate 20 that is a substrate of the mask. The birefringence element 221 shown in FIG. 12 comprises two birefringence elements 221a and 221b having different directional axes. The two birefringence elements 221a and 221b are so formed as to provide a phase difference of $\lambda/4$ ($\lambda$=wavelength), i.e. 90°, between mutually perpendicular polarized light components. Polarized light 223, such as linearly polarized light or circularly polarized light (circularly polarized light in FIG. 12), is made incident on the mask. The incident light can be converted through the mask to polarized lights 224 without mutual interference, that is, mutually perpendicular linearly polarized lights 224a and 224b in the example in FIG. 12. The polarized light 224a is linearly polarized light that is parallel to the surface of the sheet of FIG. 12, and the polarized light 224b is linearly polarized light that is perpendicular to the surface of the sheet of FIG. 12. Thus, the same effects as the polarized masks having the functions of the linear polarizers 203, 204 and 209, 210 of types A to C shown in part (b) of FIG. 11 can be obtained by using the birefringence elements.

In the case of adopting the structure using the birefringence elements of type D in FIG. 11, it is possible to use various combinations of polarization states of the right and left birefringence elements 214 and 215 and the incident light 223, as shown in FIG. 13.

In FIG. 13, two emission lights from the first element 221a and 221b shown in FIG. 12 (i.e. birefringence elements 214 and 215 in type D of FIG. 11) are incoherent in all cases.

FIG. 13 shows cases 1 to 5. In FIG. 13, symbol (i) indicates states of incident lights. In cases 1, 2 and 5, linearly polarized light is made incident. In cases 3 and 4, circularly polarized light is made incident. Symbol (ii) indicates the inclination of the fast axis in the crystal of the first element 221a. For example, in case 1, the first element 221a is positioned such that its fast axis is inclined to the right from a reference axis by $\lambda/2$, i.e. 22.5°. Symbol (iii) indicates the inclination of linearly polarized emission light (cases 1-4) or the direction of rotation of circularly polarized light (case 5), which is output from the first element 221a. Symbol (iv) indicates the inclination of the fast axis in the crystal of the second element 221b. For example, in case 1, the second element 221b is positioned such that its fast axis is inclined in the opposite direction, that is, to the left, from the reference axis by 22.5°.

In case 2, the second polarizer element is not disposed, and the incident linearly polarized light is emitted in the direction unchanged. Symbol (v) indicates the inclination of linearly polarized emission light (cases 1-4) or the direction of rotation of circularly polarized light (case 5), which is output from the second element 221b.

In cases 1 to 4, as indicated in (iii) and (v), linearly polarized light from the first element 221a and linearly polarized light from the second element 221b are so modulated as to be perpendicular to each other. In case 5, as indicated in (iii) and (v), circularly polarized light from the first element 221a and circularly polarized light from the second element 221b are rotated in opposite directions.

In FIG. 11, the linear polarizers 203, 204, 209 and 210 or the birefringence elements 214 and 215 are used as the members for realizing the polarized mask. The birefringence element can be realized using a photonic crystal or a structural birefringence element which is to be described in Example 4 below. The linear polarizer can be realized by a grid polarizer or a photonic crystal that is to be described in Example 5 below.

EXAMPLE 4

Example in Which a Structural Birefringence Element is Used as a Polarization Modulation Element In the photomask of the present invention, a structural birefringence element as shown in FIG. 14A can be used, for example, for the polarization modulation region 132 shown in FIG. 4.

The structural birefringence element refers to a birefringence element that is provided with a birefringence function by artificially forming a regular structure that is sufficiently smaller than the wavelength of light. For the formation of such a fine structure, it is possible to apply film formation technology, lithography technology, etching technology, etc., which are usually used in large-scale integration (LSI) circuits. In the structural birefringence element, birefringence occurs because the effective dielectric constant differs depending on the direction of electric field of light. The principle of the structural birefringence element is described, for instance, in M. Born, E. Wolf, "Principles of Optics" (Japanese translation) III, "14.5.2 Structural Birefringence", Tokai University, 1975, p. 1030.

FIG. 14A shows the structure of a structural birefringence element 230, for example. As shown in FIG. 14A, a plurality of parallel lattices 232 are formed on a plane-parallel plate 231. Dielectric elements 233 with a dielectric constant $\epsilon_1$ and a duty ratio $f_1$ and dielectric elements 232 with a dielectric constant $\epsilon_2$ and a duty ratio $f_2$ are alternately arranged. In the example shown in FIG. 14A, air is used as the dielectric element 333 for the purpose of convenience. The air may be replaced with another dielectric material having a dielectric constant different from the dielectric constant of the dielectric element 232.

When light is made vertically incident on the structural birefringence element 230, the effective dielectric constant differs depending on the direction of electric field of light between a case 234 in which the electric field is perpendicular to the lattices, as shown in FIG. 14B, and a case 235 in which the electric field is parallel to the lattices, as shown in FIG. 14C.

In the case where the electric field is perpendicular to the lattices, the dielectric constant can be calculated by $$\epsilon_v = \epsilon_1\epsilon_2/(f_1\epsilon_2 + f_2\epsilon_1) \qquad \text{equation 1}$$

In the case where the electric field is parallel to the lattices, the dielectric constant can be calculated by $$\epsilon_p = f_1\epsilon_1 + f_2\epsilon_2 \qquad \text{equation 2}$$

In the case of air, $\epsilon_1 = (n_1)^{1/2} = 1.0$.
In the case of silica glass, $\epsilon_2 = (n_2)^{1/2} = (1.46)^{1/2}$.
The duty is set at 0.5. That is, $f_1 = f_2 = 0.5$.
The condition for a $\lambda/4$ plate is $\lambda/4 = d(na-nb) = d(\epsilon_a^2 - \epsilon_b^2)$.
The wavelength is set at, e.g. $\lambda = 365$ nm.
Since the two values are different, a birefringence function is obtained.

Thus, the birefringence element having different effective dielectric constants depending on directions electric field can be obtained. Phase modulation regions comprising at least two layers 133 and 134, which impart a phase difference of 180° and adjoin each other, are formed on the polarization modulation regions 131 and 132 that are composed of these structural birefringence elements. In addition, amplitude modulation regions 143 for decreasing transmittance are formed on the phase modulation regions. Thus, a photomask according to the present invention is fabricated.

EXAMPLE 5

Example in Which a Photonic Crystal is Used as a Polarization Modulation Region)

In the photomask of the present invention, a photonic crystal, which is described below, may be used to form the polarization modulation region. The photonic crystal is described, for example, in Yoshino, Takeda, "Fundamentals and Applications of Photonic Crystals", Corona Publishing Co., Ltd., Apr. 28, 2004.

The photonic crystal has a periodic structure with a pitch corresponding approximately to a wavelength of light. In the photonic crystal, a state of a specific condition in which the presence of light is not allowed, that is, a photonic band gap (Photonic Band Gap), occurs due to Bragg reflection that is caused by this periodic structure. The specific condition that does not allow the presence of light is, e.g. a frequency (wavelength), polarization, and the direction of propagation.

Photonic crystals are classified into a one-dimensional photonic crystal, a two-dimensional photonic crystal and a three-dimensional photonic crystal in accordance with the dimension of the direction of light propagation in which a photonic band gap occurs. The photonic crystal used in the present invention is a one-dimensional photonic crystal in which a photonic band gap is basically exhibited only with respect to light in a direction of incidence on the mask. However, since a phenomenon in which characteristics vary depending on polarization directions is utilized, the structure itself of the photonic crystal is different from a simple stacked structure. The principle of the photonic crystal is explained below.

FIG. 15A schematically shows the structure of a two-dimensional square-lattice photonic crystal 242 including a plurality of dielectric circular rods 241. The circular rods are arranged with a pitch corresponding approximately to a wavelength of light. The arrangement is not limited to the square-lattice arrangement, and it may be, e.g. a triangular arrangement.

FIG. 15B shows a photonic band structure 243 that occurs in the two-dimensional square-grid photonic crystal 242. The abscissa indicates a wave number k, and the ordinate indicates a standardized frequency value $\omega a/2\pi c$. In this example, the ratio of the radius of the rod to the pitch is set at 0.2, the dielectric constant of the rod is set at 11.9, and the dielectric constant of the ambience (air) of the rod is set at 1.0.

In FIG. 15B, Γ, X and M are symbols that are conventionally used, and designate the origin and apices of a first Brillouin zone of the square grid. Specifically, Γ, X and M indicate states in which wave number vectors $ka/2\pi$ are (0, 0), (0.5, 0) and (0.5, 0.5). The abscissa in FIG. 15B indicates wave numbers, which are normally two-dimensional vectors, in a linearly developed form.

The standardized frequency value in the ordinate of FIG. 15B and the wave number value in the abscissa can be obtained from the values below.

$$\text{standardized frequency value} = \omega a/2\pi c \qquad \text{equation 3}$$

$$\text{wave number }(k) = ka/2\pi \qquad \text{equation 4}$$

where ω: angular frequency,
a: pitch of grid,
c: velocity of light in vacuum, and
k: wave number.

In FIGS. 15A and 15B, the electric field of light of TE mode is parallel to the surface of the drawing sheet, and the electric field of light of TM mode is perpendicular to the surface of the drawing sheet.

The dielectric circular rods 241 extend in a direction perpendicular to the surface of the drawing sheet. Consider a case where light is made incident on this structure in an X-axis direction, i.e. from the left side in FIG. 15A. In this case, it should suffice if consideration is given of the part from Γ to X in the photonic band in FIG. 15B.

A wavelength corresponding to a value, $\omega a/2\pi c = 0.35$, of the ordinate is chosen as the wavelength of incident light. If the wavelength in a vacuum is λ, $\lambda = 2\pi c/\omega$. Thus, this equation is modified to $a/\lambda = 0.35$. This means that when a wavelength of 365 nm, for example, is used, $a = 128$ nm ($= 365 \times 0.35$) is chosen as the lattice pitch.

If a band structure with this value of the ordinate is considered, a TE mode is present but a TM mode is not present. In other words, a band gap occurs in the TM mode, and this frequency is positioned in this band gap. This means that the light of the TE mode travels as such, but the light of the TM mode is reflected. In short, this photonic crystal functions as a linear polarizer.

In addition, a wavelength corresponding to a value, $\omega a/2\pi c = 0.2$, of the ordinate is chosen as the wavelength of incident light. If the same calculation as above is applied, this means that $a = 73$ nm ($= 365 \times 0.2$) is chosen as the lattice pitch.

If a band structure in FIG. 15B with this value of the ordinate is considered, both a TE mode and a TM mode are present, but the corresponding values of the abscissa are different. In other words, the wave number is different between the TE mode and TM mode. This means that a phase difference occurs after light passes through a photonic crystal with a predetermined thickness. In short, this photonic crystal has birefringence characteristics.

When the birefringence is utilized, the band gap itself is not used. However, the band structure greatly varies due to the presence of the band gap, which is a phenomenon peculiar to the photonic crystal.

The rod shape, which has been well analyzed, is exemplified above. It is understood, however, that various shapes are applicable to photonic crystals, and the method of calculation of the photonic band structure as shown in FIGS. 15A and 15B has been established.

At least two phase modulation regions 133 and 134, which impart a phase difference of 180° and adjoin each other, and amplitude modulation regions 143 for decreasing transmittance are formed on the polarization modulation regions 131 and 132 that are composed of the above-described photonic crystal. Thus, a photomask according to the present invention is fabricated.

In the above-described example, the polarization modulation layer 131 (132), phase modulation layer 133 (134) and amplitude modulation region 143 are stacked on the mask substrate 138. The order of stacking, however, is not limited, and it should suffice if the respective functions are provided on the same optical path with respect to incident light.

EXAMPLE 6

Example of a Projection Exposure Apparatus

FIG. 16 schematically shows an example of a projection exposure apparatus to which the photomask of the present invention is applied. The projection exposure apparatus shown in FIG. 16 includes a light source 301 that radiates light on a substrate 306 such as a semiconductor wafer. For example, a super-high pressure mercury lamp or an excimer laser using, e.g. KrF (248 nm) or ArF (193 nm) is usable as the light source. Light from the light source 301 is radiated via an ordinary illumination optical system 302. Thereby, a uniform luminance distribution can be obtained. The illumination optical system 302 can be constructed using, e.g. a plurality of condenser lenses, an integrator, a masking blade, etc.

The photomask 303 according to the present invention is disposed at the rear stage of the illumination optical system 302. The photomask 303 has been described above in detail referring to Examples 1 to 4. The photomask 303 comprises a pattern of a light-shield layer, polarization modulation regions, phase modulation regions and amplitude modulation means, which are disposed on the transparent substrate with predetermined structures and arrangement. Light incident on the photomask 303 is provided with a predetermined light intensity distribution which is defined by the light-shield pattern, polarization modulation means, phase modulation means and amplitude modulation means. The light emerging from the photomask 303 is made incident on the projection optical system 304. For example, an optical system composed of a plurality of ordinary lenses, an optical system composed of a mirror or an optical system composed of both elements may be used as the projection optical system 304.

The light incident on the projection optical system 304 is projected on a substrate 306 that is held on a stage 305. The position of the stage 305 is monitored by, e.g. a laser interferometer (not shown) for length measurement. The position of the substrate is detected, for example, by observing an alignment mark formed on the substrate by means of a reference microscope (not shown). The stage 305 can arbitrarily be moved along an exposure surface under the control of a stage controller 307. Thereby, radiation light from the photomask 303 can be projected on an arbitrary position on the substrate 306. Thus, a predetermined pattern, which is defined in accordance with the size and reduction ratio of the photomask 303 can be radiated at predetermined intervals.

Needless to say, the photomask of the present invention is usable in exposure apparatuses other than the above-exemplified exposure apparatus. The present invention can be practiced in various forms without departing from the spirit or the principal features of the invention. The above-described embodiments are mere examples, and the invention should not restrictively be interpreted. The scope of the invention is defined by the appended claims, and is not restricted by the description in the specification. It is, therefore, to be understood that the appended claims are intended to cover all such modifications and changes as fall within the true spirit and the scope of the invention.

What is claimed is:

1. A photomask for use in an exposure apparatus which forms an exposure pattern by illumination, comprising:
   a transparent mask substrate;
   a polarization modulation layer provided on the mask substrate and including at least two polarization modulation regions which produce mutually incoherent polarized light components, have mutually different birefringence functions, and adjoin each other, a polarization modulation shift part being formed at a position where the at least two polarization modulation regions adjoin each other;
   a phase modulation layer provided on one of the mask substrate and the polarization modulation layer and including at least two phase modulation regions which impart a phase difference of 180° and adjoin each other, a phase modulation shift part being formed at a position where the at least two phase modulation regions adjoin each other; and
   an amplitude modulation layer provided on one of the mask substrate, the polarization modulation layer, and the phase modulation layer, and including amplitude modulation regions which decrease transmittance,
   wherein a contact line between the at least two polarization modulation regions and a contact line between the at least two phase modulation regions are located at a corresponding position in a direction of illumination, thereby forming a dip part having a reduced light intensity of a transmissive light distribution, and the amplitude modulation regions are provided at positions apart from optical paths in the polarization modulation shift part and the phase modulation shift part by a predetermined distance, thereby relatively increasing the light intensity of the dip part.

2. The photomask according to claim 1, wherein a transmittance of incident light of the amplitude modulation region is 50% or less.

3. The photomask according to claim 1, wherein the two polarization modulation regions are formed of linear polarizers having mutually perpendicular axes in a plane of the polarization modulation regions.

4. The photomask according to claim 3, wherein the two linear polarizers are linear polarizers composed of electrical conductor lattices having mutually perpendicular axes.

5. The photomask according to claim 3, wherein the linear polarizer is composed of a structure having a photonic band gap with respect to a specific polarized light component.

6. The photomask according to claim 1, wherein the two polarization modulation regions are formed of elements with mutually different birefringence functions.

7. The photomask according to claim 6, wherein the elements with the birefringence functions have a phase difference of about 90° or about 180° between two polarized light components whose oscillation planes of electric vectors of light are perpendicular to each other.

8. The photomask according to any one of claims 1 to 7, wherein when linearly polarized light or circularly polarized light is made incident on the two polarization modulation regions, mutually incoherent polarized lights are output from the two polarization modulation regions.

\* \* \* \* \*